INVENTOR
ANTHONY T. MONACO

BY Mueller, Aichele & Rauner
ATTORNEYS

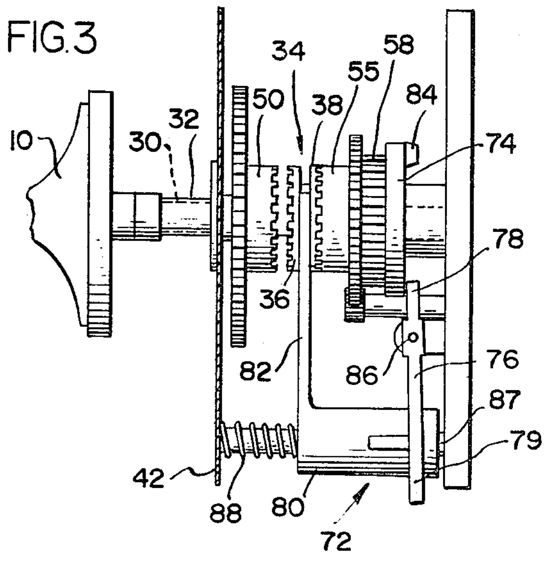
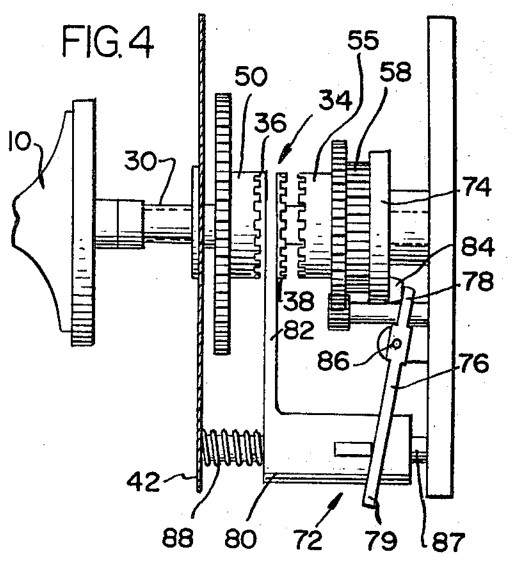
FIG.5
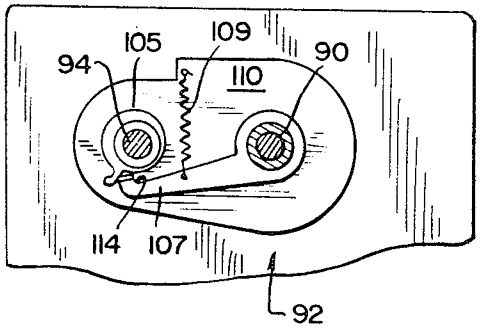
FIG.6
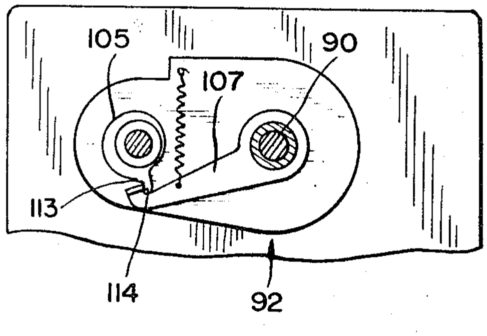
FIG.7
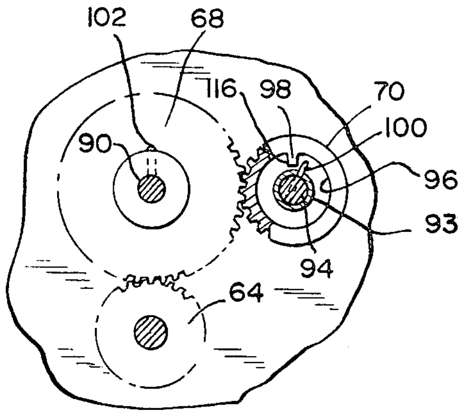
INVENTOR
ANTHONY T. MONACO
BY Mueller, Aichele & Rauner
ATTORNEYS INVENTOR
ANTHONY T. MONACO
BY Mueller, Aichele & Rauner
ATTORNEYS.

United States Patent Office 3,433,081
Patented Mar. 18, 1969

3,433,081
TUNER MECHANISM

Anthony T. Monaco, Skokie, Ill., assignor to Motorola, Inc., Franklin Park, Ill., a corporation of Illinois Filed Oct. 17, 1966, Ser. No. 587,161
U.S. Cl. 74—10.8 3 Claims
Int. Cl. F16h 35/18

ABSTRACT OF THE DISCLOSURE

A multiband tuning unit including VHF and UHF tuners each having first and second concentrically mounted signal selector knobs and shafts. The first knob is connected through the first shaft to the VHF tuner to coarse tune the same. A connecting member is slidably and rotatably mounted to the second shaft and is moved to a predetermined position on the second shaft by rotating the first knob to a preselected position thereby coupling the second knob through a first gear train to the UHF tuner. Rotation of the second knob with the first knob in the preselected position coarse tunes the UHF tuner.

This invention pertains generally to a multiband signal tuning unit and more particularly to separate VHF and UHF tuners for a television receiver combined for coarse and fine tuning adjustments of both units using two concentrically mounted tuning knobs.

Generally, in television receivers currently being produced, separate VHF and UHF tuners and associated individual tuning controls, which include at least three tuning knobs, are being used. The industry has retained the individual tuners, because of the difficulty in providing a single tuning unit with desirable manual control for selection in the entire spectrum of the television frequencies.

Numerous tuning arrangements for the coordination and control of the two separate tuning units have been proposed to enhance cabinet styling and decrease cost. But for the most part they have been relatively complicated. Since simplicity is the keynote for saleability, television manufacturers have been hesitant to incorporate these complicated devices in television receivers. Tuning devices are known that use only two knobs for tuning both VHF and UHF tuners, and have a single dial scale to indicate the selected channel. Generally these devices are limited because they can only be tuned between stops at the lower end of the VHF band and the high end of the UHF band preventing continuous tuning in a clockwise or counterclockwise direction of the VHF stations. Furthermore, in many of the receivers that provide combined tuning units when the fine tune control is operated to fine tune the VHF stations, the setting of the UHF station is changed so that when UHF reception is later desired the UHF station to which the receiver had previously been tuned is lost requiring retuning of the receiver to once again acquire the UHF station.

It is an object of this invention to provide an improved unit that uitlizes two concentrically mounted dual knobs for coarse and fine tuning both the VHF and UHF tuners of a television receiver.

Another object of this invention is to provide a device for tuning both the VHF and UHF tuners of a television receiver wherein the tuning of the VHF tuner will not disturb the setting of the UHF tuner.

A further object of the invention is to provide a device for tuning both the VHF and UHF tuners of a television receiver wherein coaxially mounted individual dials are used to indicate the VHF or UHF station to which the receiver is tuned, but which dials appear as a single dial to the operator of the receiver.

A feature of this invention is a multiband tuning unit including VHF and UHF tuners having first and second concentrically mounted signal selector knobs, the first knob being coupled to the VHF tuner to coarse tune the same, and a connecting member coupled to the first knob and being positioned by it upon rotating the knob to a predetermined position to couple the second knob through a first gear train to the UHF tuner so that rotation of the second knob with the first knob in the predetermined position coarse tunes the same.

Another feature of this invention is a multiband tuning unit including VHF and UHF tuners having fine tune gear train coupled to the VHF tuner, and wherein the connecting member is positioned by the first knob during VHF tuning to engage the fine tune gear train so that rotation of the second knob fine tunes the VHF tuner.

Another feature of this invention is a multiband tuning unit including VHF and UHF tuners having a cam driven by said first signal selector knob and a cam follower that is coupled through a slidably mounted arm to the connecting member. With the knob being rotated during VHF tuning, a spring biases the arm and connecting member into a position where the connecting member engages the VHF fine tune gear train so that rotation of the second signal selector knob fine tunes the VHF tuner. By selective rotation of the first signal selector knob to a predetermined position, which is a blank channel in the VHF tuner, the cam actuates the cam follower to move the arm to reposition the connecting member and couples the first gear train through the connecting member to the second signal selector knob so that turning the same tunes the UHF tuner.

Another feature of this invention is a multiband tuning unit including VHF and UHF tuners having a drive gear being coupled to the output of the first gear train, and a driven gear engaged by the drive gear and coupled to the UHF tuner so that positioning the connecting member with the first signal selector knob couples the first gear train to the second knob and rotation thereof actuates the drive gear to operate the driven gear to coarse tune the UHF tuner. A cam is also coupled to the output of the first gear train, and a cam follower is engaged by the cam and coupled to the driven gear. Means are provided so that by selective tuning of the second knob, the drive gear may be uncoupled from the output of the first gear train, and the cam coupled thereto and rotated to position the cam follower to move the driven gear at a rate slower than the rate of drive of said drive gear to fine tune the UHF tuner.

A further feature of this invention is a multiband tuning unit including VHF and UHF tuners having first and second coaxially mounted dials for indicating the VHF or UHF broadcast station respectively to which the tuning unit is tuned, a gear train coupled between the first signal selector knob and said first dial is continuously driven by the same to position the dial to the VHF channel to which the VHF tuner is tuned. Gear means couples the driven gear of the UHF tuner to the second dial for indicating the UHF station the unit is tuned to when coarse or fine tuning the UHF tuner. The receiver has an aperture through which the channel to which the receiver is tuned is visible. The UHF channel numbers on the first dial rotate past the aperture. The first dial also has a window through which the UHF channel numbers on the coaxially mounted second dial are visible. When the first signal selector knob is rotated to the blank VHF channel, the window on the first dial is aligned with the aperture in the receiver. Turning the second signal selector knob rotates the UHF channel numbers on the second dial past the window so they are visible in the aperture.

In practicing one embodiment of this invention, a television receiver has first and second signal selector knobs concentrically mounted thereon. The first knob is directly coupled to a VHF tuner and through a continuously driven gear train to a first indicating dial. Turning the first knob, therefore, tunes the receiver through the VHF broadcast band and drives the first dial through the gear train to indicate the VHF channel to which the receiver is tuned. Also coupled to the first selector knob is a cam which acts through a cam follower to position a connecting member which is coupled to and rotated by the second signal selector knob. When tuning the receiver through the VHF channels with the first knob, the connecting member engages in a driving relationship a VHF fine tune gear train so that when a VHF channel is selected, the second signal selector knob may be rotated to drive the fine tune gear train to fine tune the VHF channel.

The VHF tuner has an inoperative channel or off switch position, when the first signal selector knob rotates the VHF tuner to this inoperative channel, the cam actuates the cam follower to position the connecting member to engage a UHF gear train. With the connecting member in this position, rotation of the second signal selector knob is translated through the UHF gear train to coarse tune the UHF tuner to the desired station. Means are provided at the output of the UHF gear train so that by selective movement of the second knob the UHF tuner may be fine tuned. A coupling is also provided at the output of the UHF gear train to couple the movement of the second signal selector knob to a second dial coaxially mounted with respect to the first dial to indicate the UHF station to which the receiver is tuned. Although two dials are used only a single dial is visible to the viewer at any given time.

In the drawings:

FIG. 3 is a cross-section taken along the line 3—3 of FIG. 2;

FIG. 4 is a view similar to FIG. 3;

FIG. 5 is a cross-section taken along the line 5—5 of FIG. 2;

FIG. 6 is a view similar to FIG. 5;

FIG. 7 is a cross-section taken along the lines 7—7 of FIG. 2;

VHF and UHF as used in this specification refer to the assigned frequency spectrum for commercial television transmitting station. The VHF band comprises a group of 12 channels each 6 megacycles wide and occupying the frequency bands of 54 megacycles to 88 megacycles and 174 megacycles to 216 megacycles. The UHF frequency band includes some 70 channels each 6 megacycles wide and occupying the frequency bands of 470 megacycles to 890 megacycles.

Figure 1:
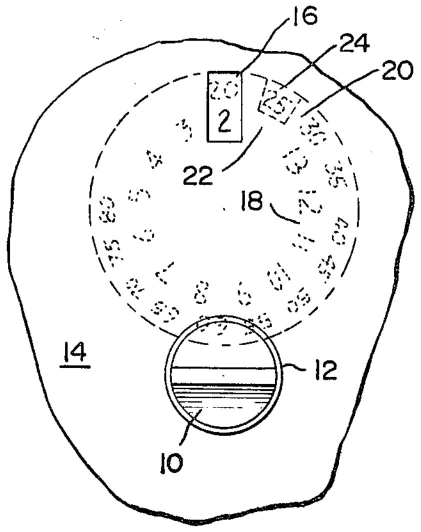
FIG. 1 is a front elevation view of the dial scale and signal selector knobs of the tuning device of this invention.
Figure 2:
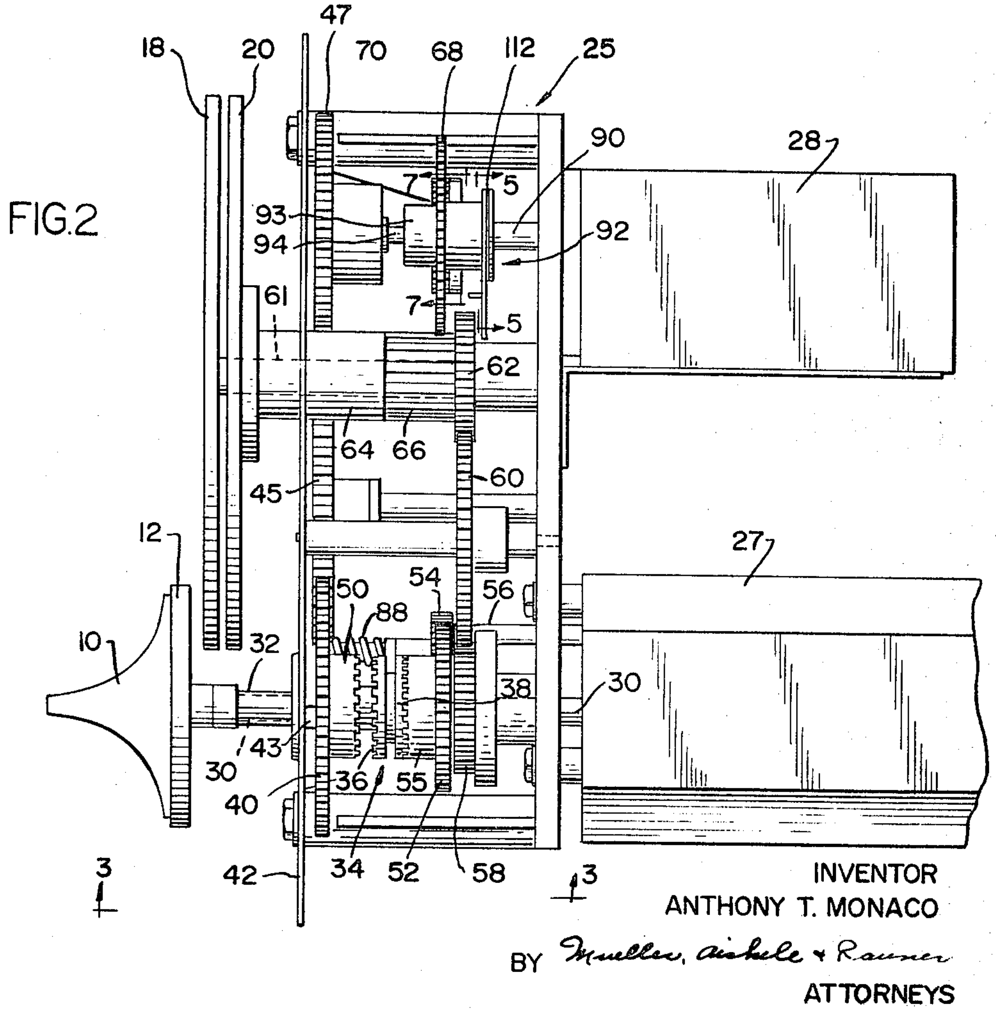
FIG. 2 is a side elevation view of the tuning device of this invention.

Referring to the drawing, FIG. 1 shows the VHF channel or signal selector knob 10 and the UHF channel or signal selector knob 12 both of which are concentrically mounted on the front of a television receiver 14. A window or aperture 16 shows the channel number on the coaxially mounted VHF dial scale 18 or UHF dial scale 20 to which the channel selector knobs 10 or 12 are positioned. The UHF signal selector knob 12 also serves to fine tune both the VHF channels and UHF channels.

It should be noted that only one window 16 is necessary to indicate either the UHF or VHF station to which the television receiver 14 is tuned. When tuning the receiver 14 to a UHF station the VHF selector knob 10 is turned until the blank spot 22 on the VHF dial 18 which represents the off or blank channel of the tuner is in the window. At this point the window 24 on the VHF dial 18 is positioned in the window 16. As the knob 12 is turned to tune the receiver to the desired UHF station (the knob 12 can only be used for UHF tuning when the knob 10 has been turned to the blank channel in the UHF tuner) the numbers appear in the window 24 and hence window 16. This in effect permits one window presentation for both the UHF and VHF station indication.

FIGS. 2 through 7 illustrate the construction of a tuning device 25 which uses only two knobs 10 and 12 to tune the VHF tuner 27 and the UHF tuner 28 respectively. The VHF signal selector knob 10 is connected directly by shaft 30 to the multiple section band switch of the VHF tuner 27, the construction and operation of which is well known in the art and which is rotated for variable step-wise selection of the VHF television channels. The knob 10 may turn the step-wise VHF tuner 27 to any one of 13 positions. Twelve of these positions correspond to VHF channels 2 through 13, and the 13th or channel 1 position corresponds to the blank or inoperative position of the VHF tuner.

A second shaft 32 is mounted concentrically with shaft 30 and is connected to the UHF signal selector knob 12. Coupled to the shaft 32 is a connecting member 34. This connecting member includes a first toothed portion 36 and a second toothed portion 38. The connecting member 34 is slidably mounted to the shaft 32 and movable between first and second positions thereon and rotatable therewith. A first or UHF gear train includes the UHF driving gear 40, which is rotatably mounted to the wall 42 of the unit 25 by shaft 43, an idler gear 45 and a driven gear 47 which is the output of the first gear train. Integral with the drive gear 40 of the UHF gear train is a toothed member 50 which can be engaged by toothed portion 36 in a driving relation.

A second or VHF fine tune gear train includes gear 52 which is journaled about the shafts 30 and 32 and engages the driven gear 54 which is coupled to shaft 56, which when rotated fine tunes the VHF tuner 27. Integral with the gear 52 is a toothed member 55 which is engageable with portion 38 in a driving relationship.

Also coupled to the shaft 30 and rotated by the turning of VHF signal selector knob 10 is the VHF dial gear train which includes driving gear 58, idler gear 60, driven gear 62 which is coupled to shaft 61 which is concentric with the UHF dial shaft 64 and connected to dial 18. Motion of the VHF dial gear train will cause rotation of the VHF station channel indicating dial 18.

The UHF dial gear train includes the gear portion 66 on shaft 64 which is coupled to UHF dial 20. Engaging gear portion 66 is a driven gear 68. The driven gear 68 is rotated by driving gear 70 when coarse tuning the UHF tuner 28 as will be explained subsequently, and is also driven by a cam means when fine tuning the UHF tuner 28 which will also be explained subsequently.

FIGS. 3 and 4 illustrate the manner in which the connecting member 34 is moved between first and second positions on the shaft 32 so that toothed portion 38 may engage member 55 as shown in FIG. 3 or so that toothed portion 36 may engage member 50 as shown in FIG. 4. The positioning device 72 includes a cam 74 that is coupled to and rotates with the driving gear 58 of the VHF dial gear train when VHF signal selector knob 10 is rotated. A cam follower 76 has an end 78 that rests on the cam 74 and an end 79 that is coupled to an arm 80. The arm 80 has a leg portion 82 that extends between the toothed portions 36 and 38 and is integral with the connecting member 34. When the VHF signal selector knob 10 positions the VHF tuner 26 in any one of the channels 2–13 the raised portion 84 of the cam 74 is clear of the end 78 of cam follower 76. However, when the selector knob 10 positions the tuner 27 in the channel 1 or off-position of the tuner, the raised portion 84 (FIG. 4) contacts the end 78 of cam follower 76 pivoting the cam follower about pivot 86. This moves the end 79 of the cam follower which moves arm 80 and leg 82 to slide the connecting member 34 along the shaft 30.

A spring 88 is compressed between the wall 42 and arm 80 and biases that arm along shaft 87 when tuning the knob 10 through the VHF channels such that it positions the connecting member 34 in a first position (FIG. 3) with the portion 38 engaging member 55 in a driving relation. When the knob 10 turns the VHF tuner 27 to the blank or off channel, the action of the cam and cam follower 76 will be to bias the arm 80 against the pressure of spring 88 to move the connecting member 34 to a second position such that the toothed portion 38 and member 55 are disengaged, and the toothed portion 36 and member 50 are engaged (FIG. 4).

The UHF tuner 28 is of the continuously variable type tunable between stops at the high and low ends of the band. The tuner 28 is driven by a shaft 90 which is selectively rotated by drive gear 70 and cam device 92. The method of selective rotation of the shaft 90 by either drive gear 70 or cam device 92 is illustrated in FIGS. 5–7. Rotation of the gear 47 which is the output of the UHF gear train causes the shaft 94 to which gear 47 is coupled to rotate. On the inner annular surface 96 of the drive gear 70 is a boss 98. Coupled to the shaft 94 and free to rotate within the inner annular space of the gear 70 is an arm 100. By selective movement of the UHF tuner drive train by UHF selector knob 12, the arm 100 may be rotated against the boss 98. In this position, continued rotation of the shaft 94 in the same direction will cause the arm to translate the motion from the shaft through the boss to the gear 70 causing the gear to rotate about its shaft 93 which is journaled about shaft 94. Upon rotation of the gear 70, the driven gear 68 will rotate to drive the gear portion 64 thereby moving the dial 20, and also moving shaft 90 to which gear 68 is coupled by the pressure of screw 102 butting against the surface of the shaft 90 thereby holding the gear in a fixed relation with respect to the shaft.

If the shaft 94 is rotated in an opposite direction by the knob 12 after the arm 100 has been butted against the boss 98, the arm 100 will be removed from contact with the boss 98 to stop the rotation of gear 70. This effectively uncouples the drive gear 70 from driving the shaft 90, because it no longer can drive driven gear 68. When the arm 100 is disengaged from the boss 98, the cam device 92 is free to move the shaft 90 in the following manner. Rotation of the shaft 94 by the output gear 47 will cause the cam 105 to be rotated. The cam 105 is an eccentric cam whose outer peripheral surface increases in a spiral-like manner. FIG. 5 shows the cam follower 107 resting against the surface of the cam 105 at the shortest radius of the spiral. As the cam 105 is rotated in a clockwise direction as viewed in FIG. 5, the spiral effect of the surface of the eccentric cam will cause the cam follower to be moved outwardly against the pressure of spring 109 that is connected between the wall 110 of UHF tuner 28 and the cam follower 107. The cam follower 107 is coupled through a clutch mechanism 112 (FIG. 2) to the shaft 90. Therefore, as the cam follower 107 moves outwardly against the spring pressure, it will act to rotate the shaft 90 to tune the UHF tuner.

The increasing radius of the spiral provides a movement of the shaft 90 which is much slower than the rate of movement caused by the ratio of the drive gear 70 to the driven gear 68. Because of this reduced rate of rotation of the cam, it permits fine tuning of the UHF tuner 28.

In FIG. 6 cam 105 has been rotated clockwise until a projection 113 on the cam surface is caught in a hook portion 114 of the cam follower 107. Simultaneously with the projection 112 striking the hook portion 114, the arm 100 will have rotated until it strikes the surface 116 of the boss 98 on the opposite side of where it had engaged the boss to turn the drive gear 70. At this point the clutch permits cam mechanism 92 to slip about the shaft 90 while drive gear 70 is once more rotated by the output gear 47 of the UHF gear train to move driven gear 68 and hence shaft 90 to coarse tune the UHF tuner.

Figures 8, 9, 10, 11:
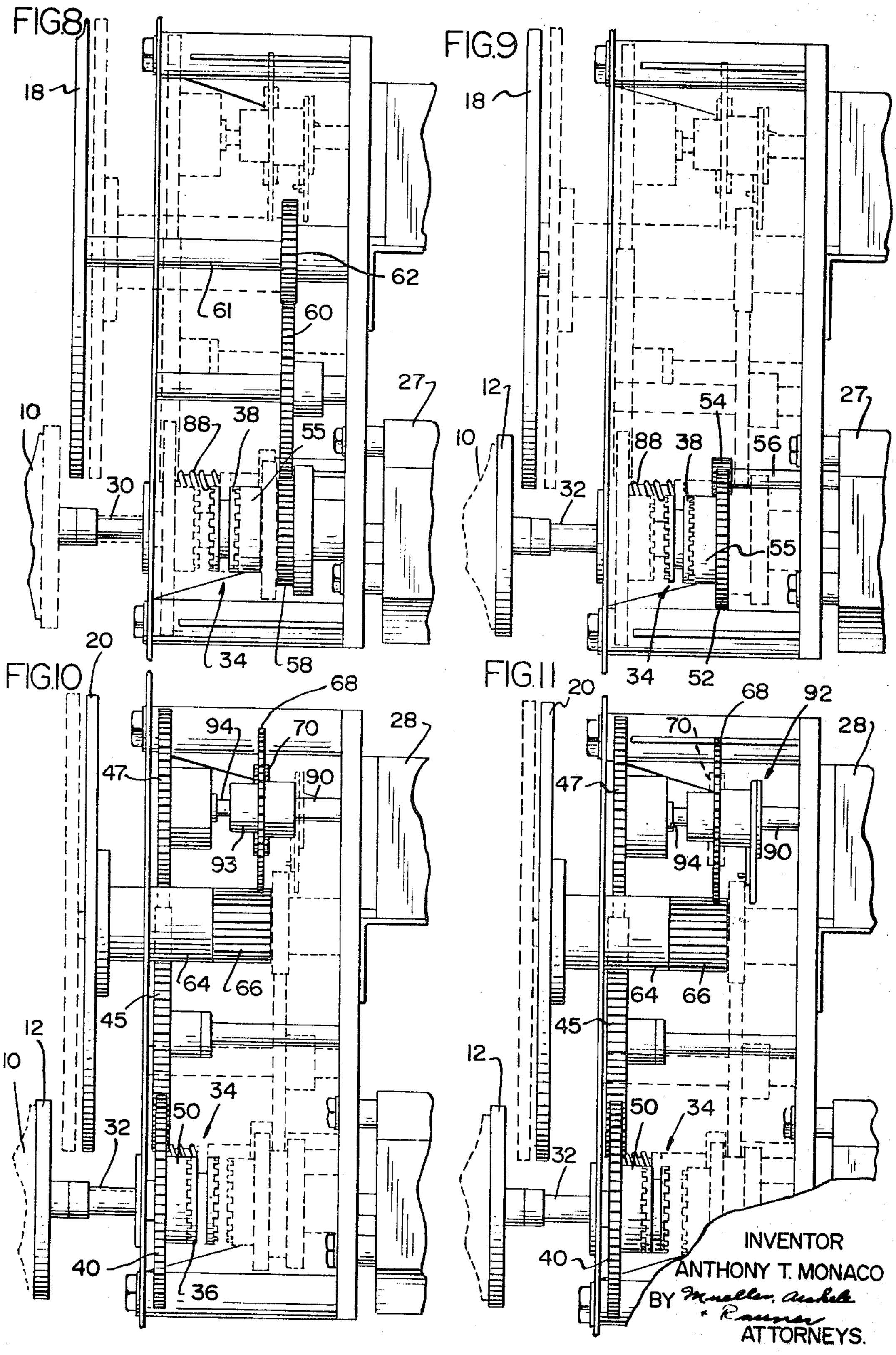
FIG. 8 is a side elevation of the tuning device of FIG. 2 partly in phantom illustrating VHF coarse tuning in accordance with this invention.
FIG. 9 is a side elevation view of the device of FIG. 2 partly in phantom illustrating VHF fine tuning.
FIG. 10 is a side elevation of the device of FIG. 2 partly in phantom illustrating UHF coarse tuning.
FIG. 11 is a side elevation view of the device of FIG. 2 partly in phantom illustrating UHF fine tuning.

Referring to FIGS. 8–11 of the drawing, a complete understanding of the operation of the tuning device 25 may be had. FIG. 8 illustrates the VHF coarse tuning. The VHF signal selector knob 10 is turned to position the VHF tuner 27 to one of the 12 VHF transmitter stations. As the shaft 30 rotates driving step-wise VHF tuner 27 from channel to channel, the VHF drive gear 58 which is coupled to shaft 30 rotates the idler gear 60 which moves the driven gear 62 to rotate shaft 61 to position the VHF dial 18 thereby indicating the channel to which the receiver is tuned.

VHF fine tuning is illustrated in FIG. 9. With knob 10 rotating the VHF tuner 27 to one of the 12 channels, the spring 88 acts to bias the connecting member 34 to a first position on the shaft 32 so that toothed portion 38 engages member 55. Rotation of the UHF signal selector knob 12 will cause the shaft 32 to rotate which acts to rotate the connecting member 34 to drive the member 55 through toothed portion 38 of the connecting member 34. Rotation of member 55 moves gear 52 to rotate driven gear 54 which motion is coupled through shaft 56 to fine tune the VHF tuner 27.

FIG. 10 illustrate UHF coarse tuning. In this operation the VHF channel selector knob 10 has been rotated to position the VHF tuner in the blank or off channel. At this point the cam 74 (FIG. 3) is operated in a manner heretofore described to slide the connecting member 34 along the shaft 32 to a second position. In this position, toothed portion 36 engages member 50. Therefore, when the UHF signal selector knob 12 is rotated, the motion is translated through shaft 32 to rotate the connecting member 34 and hence toothed portion 36 and member 50. Rotation of member 50 acts to move driving gear 40 of the UHF tuner drive gear train through idler 45 to output gear 47. Since this is coarse tuning, the UHF signal selector knob 12 has been moved to a predetermined position so that the drive gear 70 has been coupled to the shaft 94 which in turn is coupled to the output gear 47. Therefore, rotation of output gear 47 by the signal selector knob 12 through the gear train will drive shaft 94 to turn the drive gear 70. Rotation of the drive gear 70 acts to move driven gear 68. Rotation of driven gear 68 which engages the gear portion 66 on shaft 64 causes rotation of the UHF dial 20 to indicate the station to which the dial has been tuned. Rotation of the drive gear 70 by the shaft 94 also is translated through shaft 90 to the UHF tuner 28 to coarse tune that tuner.

Fine tuning of UHF is illustrated in FIG. 11. In this operation, the UHF signal selector knob 12 is selectively turned so that the drive gear 70 is uncoupled from the shaft 94 as described. If the drive grear 70 is uncoupled from shaft 94, rotation of the knob 12 actuates the cam device 92 to drive driven gear 68 which rotates shaft 90 to fine tune the UHF tuner 28 as previously described. The driven gear 68 also drives the gear portion 66 on the shaft 64 to reposition the UHF dial 20.

It should be noted that through the use of the connecting member 34 it is possible to rotate the VHF signal selector knob 10 continuously in either the clockwise or counterclockwise direction through all of the VHF channels without disturbing the setting of the UHF tuner. This is because the UHF tuner 28 may be varied only by rotation of the UHF signal selector knob 12 after the VHF signal selector knob 10 has been rotated to the blank or off channel of the VHF tuner. Only at this point is the knob 12 coupled to the UHF drive gear train through the connecting member 34. The connecting member 34 also permits fine tuning of both the UHF tuner and VHF tuner through rotation of the UHF signal selector knob 12.

What has been described, therefore, is an improved tuning unit for a television receiver that utilizes two concentrically mounted dual knobs used for both coarse and fine tuning of both the VHF and UHF tuners of a television receiver. Although individual dials are used to indicate the VHF and UHF channels to which the receiver is tuned only a single dial is visible to the viewer at any given time. The VHF tuner may be continuously tuned in either a clockwise or counterclockwise direction without disturbing the setting of the UHF tuner.

I claim:

1. A device for tuning a television receiver capable of receiving VHF and UHF signals including in combination, a stepwise variable VHF tuner and a continuously variable UHF tuner, concentrically mounted first and second rotatable signal selector means, a first shaft coupling said first signal selector means to said VHF tuner so that rotation of said first signal selector means tunes said VHF tuner, a second shaft concentric with respect to said first shaft and connected to said second signal selector means, a first gear train, a third shaft coupled to the output of said first gear train, a drive gear rotatably coupled to said third shaft, and a driven gear engaging said drive gear and being coupled to said UHF tuner, a connecting member slidably and rotatably mounted to said second shaft and slidably movable between first and second positions thereon, and positioning means responsive to rotation of said first signal selector means to a predetermined position to slide said connecting member on said second shaft to said first position to engage said connecting member with said first gear train in a driving relation so that rotation of said second signal selector means with said first signal selector means in said predetermined position tunes said UHF tuner, and a cam coupled to said third shaft, a cam follower engaging said cam and being coupled to said driven gear, said cam being selectively rotated by said second signal selector means to engage said cam follower to drive said driven gear, and means for uncoupling said drive gear from said third shaft with said selective rotation of said second signal selector means to rotate said cam, said cam driving said driven gear at a rate slower than the rate of said drive gear to provide fine tuning for said VHF tuner.

2. The device for tuning a television receiver of claim 1 further including a dial for indicating the UHF transmitting station to which the UHF tuner is tuned, gear means coupled to said dial, said gear means engaging said driven gear so that rotation of said second signal selector means with said connecting member in said first position causes said drive gear to rotate said driven gear to position said dial to indicate the UHF transmitting station to which the receiver is coarse tuned, and said cam follower driving said driven gear during fine tuning of said UHF tuner to position said dial to indicate the UHF transmitting station to which the receiver is fine tuned.

3. A device for tuning a television receiver capable of receiving VHF and UHF signals including in combination, a stepwise variable VHF tuner and a continuously variable UHF tuner, concentrically mounted first and second rotatable signal selector means, a first shaft coupling said first signal selector means to said VHF tuner so that rotation of said first signal selector means tunes said VHF tuner, a second shaft concentric with respect to said first shaft and connected to said second signal selector means, a first gear train, means coupling said first gear train to said UHF tuner, a connecting member slidably and rotatably mounted to said second shaft and slidably movable between first and second positions thereon, positioning means responsive to rotation of said first signal selector means to a predetermined position to slide said connecting member on said second shaft to said first position to engage said connecting member with said first gear train in a driving relation so that rotation of said second signal selector means with said first signal selector means in said predetermined position tunes said UHF tuner, and first and second coaxially mounted dials for indicating the VHF and UHF transmitting stations to which the VHF and UHF tuners are tuned, respectively, a drive gear connected to said first shaft and rotatable therewith, a second gear train coupled to said VHF dial for rotating the same, said drive gear continuously engaging said second gear train and driving the same in response to rotation of said first signal selector means to position said first dial, a third gear train coupled to said second dial, and means coupling said first gear train to said third gear train in a driving relation, said third gear train being responsive to the rotating of the second signal selector means to drive said first gear train to position said second dial.

References Cited

UNITED STATES PATENTS

| | | | |
|---|---|---|---|
| 2,756,599 | 7/1956 | Sperber | 74—10.5 |
| 2,839,936 | 6/1958 | Dawson | 74—10.54 |
| 3,251,234 | 5/1966 | Valdettaro | 74—10.5 |
| 3,285,078 | 11/1966 | Siebold | 74—10.54 |

MILTON KAUFMAN, *Primary Examiner.*

U.S. Cl. X.R.

74—10.45; 335—276